US011652347B2

(12) United States Patent
Liu et al.

(10) Patent No.: US 11,652,347 B2
(45) Date of Patent: May 16, 2023

(54) METHOD, SYSTEM AND APPARATUS FOR FAULT DETECTION IN LINE PROTECTION FOR POWER TRANSMISSION SYSTEM

(71) Applicant: Hitachi Energy Switzerland AG, Baden (CH)

(72) Inventors: Kai Liu, Beijing (CN); Youyi Li, Vasteras (SE); Jianping Wang, Vasteras (SE)

(73) Assignee: Hitachi Energy Switzerland Ltd, Baden (CH)

( * ) Notice: Subject to any disclaimer, the term of this patent is extended or adjusted under 35 U.S.C. 154(b) by 537 days.

(21) Appl. No.: 16/103,141

(22) Filed: Aug. 14, 2018

(65) Prior Publication Data

US 2019/0004103 A1 Jan. 3, 2019

Related U.S. Application Data

(63) Continuation of application No. PCT/CN2016/079323, filed on Apr. 14, 2016.

(51) Int. Cl.
*H02H 1/00* (2006.01)
*H02H 3/38* (2006.01)
(Continued)

(52) U.S. Cl.
CPC .............. *H02H 3/38* (2013.01); *G01R 31/08* (2013.01); *G01R 31/52* (2020.01); *H02H 1/0007* (2013.01)

(58) Field of Classification Search
CPC ...... G01R 31/50; G01R 31/52; G01R 31/088; G01R 31/085; H02H 3/38; H02H 1/0007; H02H 3/40
See application file for complete search history.

(56) References Cited

U.S. PATENT DOCUMENTS

| 4,183,072 A | 1/1980 | Takagi et al. | |
| 4,866,393 A * | 9/1989 | Iwai | G01R 31/00 324/549 |

(Continued)

FOREIGN PATENT DOCUMENTS

| CN | 86107283 A | 5/1988 |
| CN | 1261672 A | 8/2000 |

(Continued)

OTHER PUBLICATIONS

G. Nimmersjö et al., "A New Approach to High Speed Relaying Based on Transient Phenomena," Fourth International Conference on Developments in Power Protection, dated Aug. 6, 2002, pp. 140-145, IET, New Jersey, USA.

(Continued)

*Primary Examiner* — Jeff W Natalini
(74) *Attorney, Agent, or Firm* — Slater Matsil, LLP

(57) ABSTRACT

A method, system and apparatus of fault detection in line protection for a power transmission system. A voltage (u) at a measurement point on an electrical line is obtained. The measurement point is a point at which a protection device for the line protection is installed. A current (i) at the measurement point is further obtained and a differential value of the current is determined. Then, a voltage ($u_q$) at a setting point on the electrical line is determined from the voltage (u) at the measurement point, the current (i) at the measurement point and the differential value of the current (i) according to a time domain lumped parameter model for the electrical line. The voltage change between the determined voltage at the setting point during the fault period and a voltage at the setting point determined during a pre-fault period can be further determined. The fault detection can be performed based on the determined voltage change and a fault threshold. It can ensure voltage determination accuracy and detection reliability with a low sampling rate. Moreover, the (Continued)

solution can work right after the fault inception, almost no waiting time is required, and thus it may achieve a super-fast line protection.

22 Claims, 5 Drawing Sheets

(51) Int. Cl.
*G01R 31/08* (2020.01)
*G01R 31/52* (2020.01)

(56) References Cited

U.S. PATENT DOCUMENTS

| | | | |
|---|---|---|---|
| 6,601,001 | B1 | 7/2003 | Moore |
| 6,647,346 | B1* | 11/2003 | Zikes .................. F04B 49/065 |
| | | | 702/184 |
| 9,478,968 | B2* | 10/2016 | Blumschein ............ G01R 31/50 |
| 2003/0060991 | A1* | 3/2003 | Stoupis ................. H02H 7/267 |
| | | | 702/58 |
| 2007/0279068 | A1* | 12/2007 | Harres ................. H02H 1/0015 |
| | | | 324/522 |
| 2010/0289336 | A1* | 11/2010 | Sugita .................. H02J 7/1461 |
| | | | 307/66 |
| 2012/0086459 | A1 | 4/2012 | Kim |
| 2013/0304406 | A1 | 11/2013 | Kim |
| 2015/0081235 | A1 | 3/2015 | Schweitzer, III et al. |
| 2016/0072391 | A1* | 3/2016 | Sato .................. H02M 3/33523 |
| | | | 363/21.13 |
| 2016/0077162 | A1* | 3/2016 | Chen ...................... H02M 1/32 |
| | | | 324/764.01 |

FOREIGN PATENT DOCUMENTS

| | | |
|---|---|---|
| CN | 1489819 A | 4/2004 |
| CN | 101232177 A | 7/2008 |
| CN | 101242094 A | 8/2008 |
| CN | 102570428 A | 7/2012 |
| CN | 102621388 A | 8/2012 |
| CN | 102288874 B | 7/2014 |
| EP | 1020729 A1 | 7/2000 |
| WO | 03003026 A2 | 1/2003 |

OTHER PUBLICATIONS

NR Electric Co., Ltd, "3.4 Power Frequency Variation Distance Relay," RCS-931A Line Differential Protection Technical Manual, dated Jun. 2002, 4 pp., vol. 1, No. 10, NARI Technology Development Limited Co., China.

The State Intellectual Property Office of the P.R. of China, First Office Action in corresponding application No. 201680080756.9, dated Feb. 21, 2020, 6 pp.

The State Intellectual Property Office of the P.R. of China, Search Report in corresponding application No. 201680080756.9, dated Dec. 30, 2019, 2 pp.

State Intellectual Property Office of the P.R. China, International Search Report & Written Opinion issued in corresponding Application No. PCT/CN2016/079323, dated Jan. 20, 2017, 12 pp.

European Patent Office, Extended European Search Report in corresponding application No. 16898242.9, dated Dec. 19, 2019, 12 pp.

E. C. M. Costa et al., "Estimation of transmission line parameters using multiple methods," IET Generation, Transmission & Distribution, dated Aug. 7, 2015, pp. 2617-2624, vol. 9, No. 16, IET, New Jersey, USA.

R. Schulze et al., "Parameter Identification of Unsymmetrical Transmission Lines Using Fault Records Obtained From Protective Relays," IEEE Transactions on Power Delivery, dated Apr. 2011, pp. 1265-1272, vol. 26, No. 2, IEEE, Piscataway, USA.

B. Vyas et al., "Protection of series compensated transmission line: Issues and state of art," Electric Power Systems Research, dated Sep. 24, 2013, pp. 93-108, vol. 107, Elsevier B.V., Amsterdam, Netherlands.

* cited by examiner

METHOD, SYSTEM AND APPARATUS FOR FAULT DETECTION IN LINE PROTECTION FOR POWER TRANSMISSION SYSTEM

FIELD OF THE INVENTION

The non-limiting and exemplary embodiments of the present disclosure generally relate to the field of power transmission, and more particularly relate to a method, system and apparatus for fault detection in line protection for a power transmission system.

BACKGROUND OF THE INVENTION

This section introduces aspects that may facilitate a better understanding of the disclosure. Accordingly, the statements of this section are to be read in this light and are not to be understood as admissions about what is in the prior art or what is not in the prior art.

Distance protection is one of line protection technologies, which determines a distance between a fault point and a point at which a protection device is installed and the time for actions based on the determined distance. The distance protection is one of the most important protections for extra/ultra-high voltage (EHV/UHV) transmission line systems for both technical and business reasons. For line distance protection, the fast operation is one of the most important features and it is also one of the most important requirements of customers. Fault detection is a key technology for the line distance protection since it is a main criterion triggering the distance protection.

In an article titled "A new approach to high speed relaying based on transient phenomena" (Fourth International Conference on Developments in Power Protection, 11-13 Apr. 1989, Page(s):140-145) by Gunnar Nimmersjo, Murari Mohan Saha, there is disclosed a fault detection solution, in which it is proposed to use the telegraph equation to calculate the voltage at a setting point and compare the calculated voltage with a predetermined threshold to determine whether there is a fault. Particularly, in this solution, it first calculates voltage $u_q$ at the setting point before a fault, memorized as $u_q$; then calculates $u_q$ after the fault and calculates $\Delta U_q = U_q - U_q'$ based on the calculated $u_q$ and $u_q'$; if $\delta u_q = |\Delta U_q| - |U_q'| > 0$, then it determines that there is an internal fault. This method can achieve a rather high speed protection in theory but it needs a very high sampling rate to achieve enough accuracy, which is not practical.

In another traditional solution, a different distance protection solution is proposed, which is called a faulty component distance protection. In the solution, it is proposed to calculate the voltage at the setting point to detect the fault, wherein the voltage at the setting point is calculated by voltage and current vectors which are determined by the Fourier algorithm. However, this solution is based on vectors and it might have troubles to calculate vectors accurately in a very short data window and thus the performance of this solution will be influenced seriously by errors.

SUMMARY OF THE INVENTION

Various embodiments of the present disclosure mainly aim at providing a solution for fault detection in line protection for a power transmission system to solve or at least partially mitigate at least a part of problems in the prior art. Other features and advantages of embodiments of the present disclosure will also be understood from the following description of specific embodiments when read in conjunction with the accompanying drawings, which illustrate, by way of example, the principles of embodiments of the present disclosure.

According to a first aspect of the present disclosure, a method for fault detection in the line protection for a power transmission system is provided. The method comprises obtaining a voltage at a measurement point on an electrical line. The measurement point is a point at which a protection device for the line protection is installed. The method also comprises obtaining a current at the measurement point and determining a differential value of the current. The method further comprises determining a voltage at a setting point on the electrical line from the voltage at the measurement point and the current at the measurement point as well as the differential value of the current according to a time domain lumped parameter model for the electrical line. The voltage change between the determined voltage at the setting point during the fault period and a voltage at the setting point determined during the pre-fault time period can be further determined. The fault detection can be performed based on the determined voltage change and a fault threshold.

In an embodiment of the present disclosure, the determining a voltage at a setting point may be performed based on a differential equation.

In another embodiment of the present disclosure, the differential equation may include:

$$u_q(t) = u(t) - R*i(t) - L*\frac{di(t)}{dt}$$

wherein u(t) represents the voltage at the measurement point; i(t) represents the current at the measurement point, R represents a resistance value of a resistor in the lumped parameter model, and L represents an inductance value of an inductor in the lumped parameter model and $$\frac{di(t)}{dt}$$

represents the differential value of the current i(t). If we consider the discrete time system domain, for example a sample point at instant k, the above equation can be rewritten as below to represent the calculation in discrete time domain:

$$u_{q\_k} = u_k - \left(R \cdot i_k + L \cdot \frac{di_k}{dt}\right)$$

wherein, $u_k$ represents the voltage at the protection installation point, $i_k$ represents the current at the protection installation point, R represents a resistance value of a resistor in the lumped model, and L represents an inductance value of an inductor in the lumped model and $$\frac{di_k}{dt}$$

represents the differential value of the current $i_k$ ($di_k=i_k-i_{k-1}$; dt=a sample interval for the given sampling rate; $i_{k-1}$ means the measured current at the time instant k−1 which is previous of time instant k in the discrete time domain). In a further embodiment of the present disclosure, the time domain lumped parameter model may comprise any types of a Resistor-Inductor-Capacitor (RLC) model or a Resistor-Inductor (RL) model.

In a still further embodiment of the present disclosure, the obtaining of a current at the measurement point may comprise obtaining a phase current at the measurement point; and removing, from the phase current, at least one of a capacitive current to the ground, and a capacitive current between phases.

In another embodiment of the present disclosure, the fault threshold may be a product of a reliable coefficient and the voltage at the setting point determined during the pre-fault period.

In a further embodiment of the present disclosure, the fault threshold may be a product of a reliable coefficient and a rating voltage of the electrical line.

In a second aspect of the present disclosure, there is further provided a system for fault detection in line protection for a power transmission system. The system comprises one or more processors; a memory coupled to at least one of the processors; and a set of program instructions stored in the memory. The program instructions are executable by at least one of the processors to cause the system to: obtain a voltage at a measurement point, at which a protection device is installed, on an electrical line; obtain a current at the measurement point; determine a differential value of the current; determine a voltage at a setting point on the electrical line from the voltage at the measurement point, the current at the measurement point and the differential value of the current according to a time domain lumped parameter model for the electrical line; determine a voltage change between the determined voltage at the setting point during the fault period and a voltage at the setting point determined during the pre-fault period; and perform the fault detection based on the determined voltage change and a fault threshold.

In a third aspect of the present disclosure, there is further provided an apparatus for fault detection in line protection. The apparatus may comprise a voltage obtainment module, a current obtainment module, a differential value determination module, a voltage determination module, a change determination module and a fault detection module. The voltage obtainment module may be configured to obtain a voltage at a measurement point, at which a protection device is installed, on an electrical line. The current obtainment module may be configured to obtain a current at the measurement point. The differential value determination module may be configured to determine a differential value of the current. The voltage determination module may be configured to determine a voltage at a setting point on the electrical line from the voltage at the measurement point, the current at the measurement point and the differential value of the current according to a time domain lumped parameter model for the electrical line. The change determination module can be configured to determine a voltage change between the determined voltage at the setting point during the fault period and a voltage at the setting point determined during the pre-fault period. The fault detection module can be configured to perform the fault detection based on the determined voltage change and a fault threshold.

With embodiments of the present disclosure, when the voltage at the setting point is determined, the time domain lumped parameter model is used for the electric line system and differential value of the current at the measurement point is used. Due to the use of the time domain lumped parameter model, voltage determination accuracy and thus detection reliability can be ensured and meanwhile, the use of differential value makes lowering of the sample rate possible and thus it does not involve errors caused by calculating vectors. Besides, the solution can work right after the fault inception, almost no waiting time is required, and thus it may achieve a super-fast line protection.

BRIEF DESCRIPTION OF THE DRAWINGS

The above and other aspects, features, and benefits of various embodiments of the present disclosure will become more fully apparent, by way of example, from the following detailed description with reference to the accompanying drawings, in which like reference numerals or signs are used to designate like or equivalent elements. The drawings are illustrated for facilitating better understanding of the embodiments of the disclosure and not necessarily drawn to scale, in which.

DETAILED DESCRIPTION OF EMBODIMENTS

Figure 1:
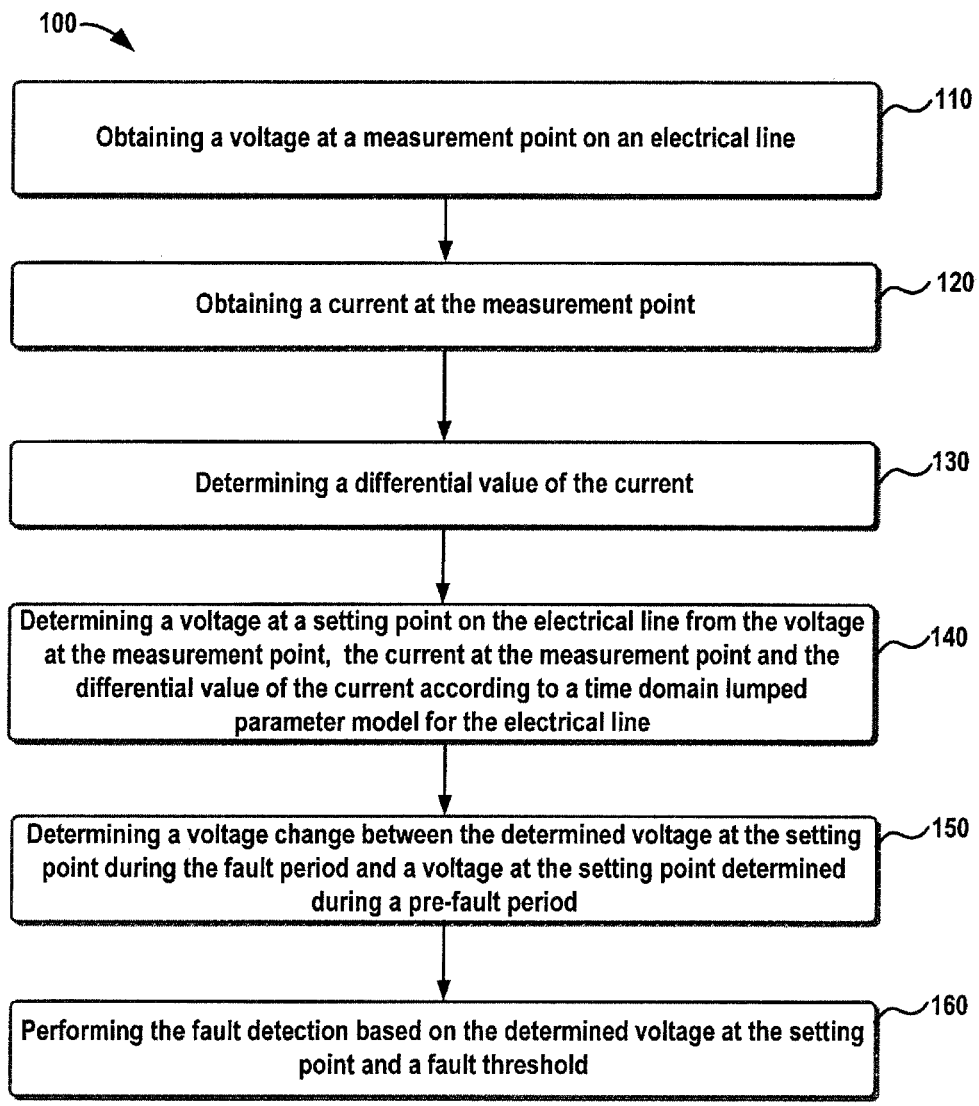
FIG. 1 schematically illustrates a flow diagram of a method of fault detection in line protection for a power transmission system according to an embodiment of the present disclosure.

Hereinafter, the principle and spirit of the present disclosure will be described with reference to illustrative embodiments. It shall be understood, all these embodiments are given merely for one skilled in the art to better understand and further practice the present disclosure, but not for limiting the scope of the present disclosure. For example, features illustrated or described as part of one embodiment may be used with another embodiment to yield still a further embodiment. In the interest of clarity, not all features of an actual implementation are described in this specification.

References in the specification to "one embodiment," "an embodiment," "an example embodiment," etc. indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It shall be understood that, although the terms "first" and "second" etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed terms.

The terminology used herein is for the purpose of describing particular embodiments only and is not intended to be liming of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof. It will be also understood that the terms "connect(s)," "connecting", "connected", etc. when used herein, just means that there is an electrical connection between two elements and they can be connected either directly or indirectly, unless explicitly stated to the contrary.

In the following description and claims, unless defined otherwise, all technical and scientific terms used herein have the same meaning as commonly understood by one of ordinary skills in the art to which this disclosure belongs. The term "protection device" means a device such as a distance relay, which is installed on a point of the transmission line for providing line protection within its protection zone when there is a fault in the zone. The term "measurement point" used herein means a point on the transmission line, at which the measurements are performed to obtain any of current and voltage and it usually is located where the protection device is installed. The "setting point" herein means a predetermined point on the transmission line, the voltage at which will be used to detect fault and the "setting point" is usually the end point of protection zone of the protection device.

As mentioned in Background, in the conventional solutions, the distance protection based on the telegraph equation requires a very high sampling rate and due to high demand on sampling frequencies, it is not practical in real applications. On the other hand, the fault component distance protection based on vectors might have troubles to calculate vectors accurately in a very short data window. Therefore, in embodiments of the present disclosure, there is provided a solution for fault detection in line protection for a power transmission. In embodiments of the present disclosure, a voltage and a current at a measurement point (where a protection device for the line protection is installed) on an electric line are obtained and a differential value of the current is obtained. A voltage at a setting point is determined from the voltage and the current at the measurement point and the differential value of the current according to a time domain lumped parameter model for the electric line. Then, the determined voltage can be used to perform fault detection in line protection. Due to the use of the time domain lumped parameter model, voltage determination accuracy and thus detection reliability can be ensured and meanwhile, the use of differential value makes lowering of the sample rate possible and thus it does not involve errors caused by calculating vectors. Besides, the solution can work right after the fault inception, almost no waiting time is required, and thus it may achieve a super-fast line protection. Hereinafter, specific embodiments of the present disclosure will be described with reference to FIGS. 1 to 11.

Reference is first made to FIG. 1, which schematically illustrates a flow diagram of a method 100 of fault detection in line protection for a power transmission system according to an embodiment of the present disclosure.

As illustrated in FIG. 1, the method starts from step 110, in which a voltage at a measurement point is obtained. As mentioned before, the term "measurement point" used herein refers to a point on the electric line, at which the measurements are performed to obtain any of current and voltage and it usually is located where the protection device is installed. The protection device may be any type of protection devices, for example, a distance relay. The voltage at the measurement point can be measured by any suitable voltage measurement means in the art. For example, it may install a voltage measurement device at or near the measurement point and use the voltage measurement device to measure the voltage $u_k$ at the measurement point. Thus, the voltage at the measurement point can be obtained from the voltage measurement device directly or from a database or a repository storing voltage measurements from the voltage measurement device. The voltage measurement device and the measuring of voltage are known in the art and thus will not be elaborated herein.

In step 120, the current at the protection device is obtained. Similarly to the voltage at the protection device, the current at the measurement point can be measured by any suitable current sensing means in the art. For example, it may arrange a current sensing device, such as a current transformer, a sensing resistor, etc., at or near the measurement point and use the current sensing device to measure the current at the measurement point. Thus, the current at the measurement point can be obtained from the current sensing device directly or from a database or a repository storing current measurements from the current sensing device. The current sensing device and the measuring of current are known in the art and thus will not be elaborated herein as well.

Further in step 130, a differential value of the current at the measurement point is determined. In this step, the current at the measurement point can be differentiated with respect to time t, thereby obtaining the differential value of the current at the measurement point. This differential value of the current will be used to determine a voltage at a setting point.

Next, in step 140, a voltage at a setting point on the electrical line can be determined from the obtained voltage at the measurement point, the obtained current at the measurement point and the determined differential value of the current according to a time domain lumped parameter model for the electrical line. The time domain lumped parameter model may be for example an RLC model or an RL model.

The RLC model is one of the lumped parameter model and it is an example equivalent model used for the electrical line in the present disclosure. The RLC model comprises a resistor, an inductor and a capacitor. In other words, the whole transmission line can be represented by an equivalent circuit containing a resistor, an inductor and a capacitor. For illustrative purposes, reference is made to FIG. 2 to describe an example RLC model for a transmission line system.

Figure 2:
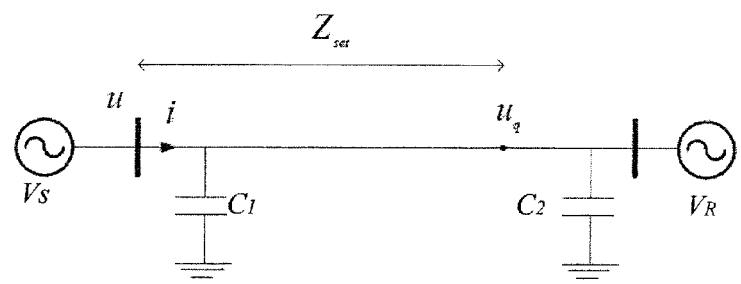
FIG. 2 schematically illustrates an example RLC model for a transmission line according to an embodiment of the present disclosure.

As illustrated in FIG. 2, the RLC model is a standard PI-type line model. The voltage at the start point is denoted by Vs and the voltage at the end point is denoted by $V_R$; the voltage and current at the measurement point are denoted by u and i respectively, the voltage at a setting point is denoted by $u_q$. The transmission line between the start point and the end point can be equivalent to a resistor and an inductor connected in series and two capacitors $C_1$ and $C_2$ which are respectively connected to the start point and the end point of the transmission line.

The impedance of the protection zone can be denoted by $Z_{set}$:

$$Z_{set} = R + jX \quad (1)$$

wherein $Z_{set}$ denotes the impedance of the protection zone, R denotes the resistance of the equivalent resistor of the transmission line and X denotes the inductance of the equivalent inductor of the transmission line. It shall be understood that although FIG. 2 illustrates the RLC model as a PI-type RLC model, the present disclosure is not limited thereto. The RLC model can also be any other forms of RLC model, a T-type RLC model, Tau-type RLC model, or some modified versions thereof. In addition, it may also use an further simplified RL model for the transmission line system.

In some embodiments of the present disclosure, it can erase a capacitive current in a phase current. That is to say, after a phase current is obtained, at least one of a capacitive current to the ground and a capacitive current between phases can be removed from the obtained phase current.

Figure 3:
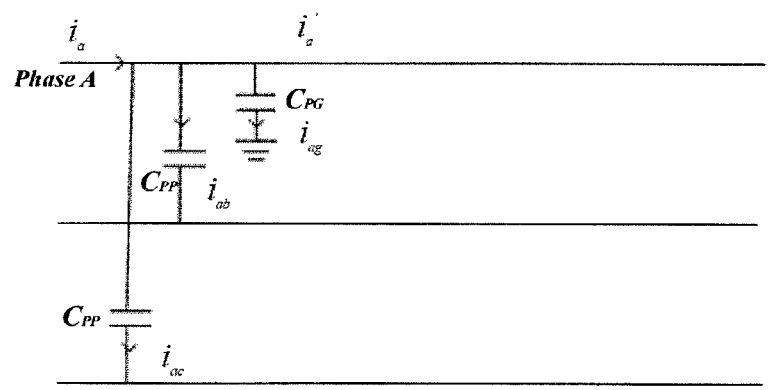
FIG. 3 schematically illustrates a diagram of a capacitive current path for phase A according to an embodiment of the present disclosure.

For illustration purposes, FIG. 3 schematically illustrates of a diagram of a capacitive current path for phase A according to an embodiment of the present disclosure. As illustrated in FIG. 3, for phase A, there is a capacitance $C_{PG}$ of the line for phase A to the ground, a first capacitance $C_{PP}$ between the line for phase A and the line for phase B, and a second capacitance $C_{PP}$ between the line for phase A and the line for phase C. The capacitive currents related to capacitances $C_{PG}$, the first $C_{PP}$ and the second $C_{PP}$ are denoted by $i_{ag}$, $i_{ab}$, $i_{ac}$, respectively. The currents $i_{ag}$, $i_{ab}$, $i_{ac}$ can be obtained by following equations:

$$i_{ag} = C_{PG} \times \frac{du_a}{dt} \quad (2)$$

$$i_{ab} = C_{PP} \times \frac{du_{ab}}{dt} \quad (3)$$

$$i_{ac} = C_{PP} \times \frac{du_{ac}}{dt} \quad (4)$$

wherein $u_a$ represents the phase voltage of phase A; $u_{ab}$ represents a voltage difference between the phase voltage $u_a$ and a phase voltage $u_b$ representing the phase voltage of phase B, i.e., $u_{ab}=u_a-u_b$; $u_{ac}$ represents a voltage difference between the phase voltage $u_a$ and a phase voltage $u_c$ representing the phase voltage of phase B, i.e., $u_{ac}=u_a-u_c$. Thus, the current $i_a'$, which represents a current of phase A by removing the capacitive current impact can be determined based on the following equations.

$$i_a' = i_a - \left( C_{PG} \times \frac{du_a}{dt} + C_{PP} \times \frac{du_{ab}}{dt} + C_{PP} \times \frac{du_{ac}}{dt} \right) \quad (5)$$

Similarly, currents $i_b'$, $i_c'$ can represent phase currents by removing the capacitive current impact for phase B and phase C, respectively, and they can be determined as follows:

$$i_b' = i_b - \left( C_{PG} \times \frac{du_b}{dt} + C_{PP} \times \frac{du_{ba}}{dt} + C_{PP} \times \frac{du_{bc}}{dt} \right) \quad (6)$$

$$i_c' = i_c - \left( C_{PG} \times \frac{du_c}{dt} + C_{PP} \times \frac{du_{ca}}{dt} + C_{PP} \times \frac{du_{cb}}{dt} \right) \quad (7)$$

wherein $u_b$ represents the voltage of phase B; $u_c$ represents the voltage of phase C; $u_{ba}$ represents the voltage difference between the phase voltage $u_b$ and the phase voltage $u_a$, i.e., $u_{ba}=u_b-u_a$; $u_{ca}$ represents the voltage difference between the phase voltage u and the phase voltage $u_a$, i.e., $u_{ca}=u_c-u_a$; $u_{bc}$ represents the voltage difference between the phase voltage $u_b$ and the phase voltage $u_c$, i.e., $u_{bc}=u_b-u_c$; $u_{cb}$ represents the voltage difference between the phase voltage $u_c$ and the phase voltage $u_b$, i.e., $u_{cb}=u_c-u_b$.

Figure 4:
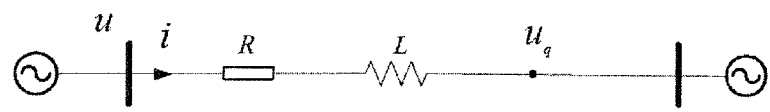
FIG. 4 schematically illustrates a single line diagram for the transmission line according to an embodiment of the present disclosure.

Thus, in embodiments of the present disclosure, it may use the current $i_a'$, $i_b'$, $i_c'$, which do not contain capacitive current, instead of the original sampled currents $i_a$, $i_b$, $i_c$. If the capacitive currents are erased from the phase current, then the model of the transmission can be further reduced. For illustration purposes, FIG. 4 schematically illustrates a single line diagram for the transmission line according to an embodiment of the present disclosure. FIG. 4 is similar to that model as illustrated in FIG. 2, but resistor R and inductor L are illustrated in details and capacitors connected at the start point and the end point are removed since the capacitive currents are removed from the phase current.

Based on the single line diagram as illustrated in FIG. 4, the voltage at the setting point $u_q$ can be determined based on a differential equation such as:

$$u_q(t) = u(t) - R * i(t) - L * \frac{di(t)}{dt} \quad (8)$$

wherein u(t) represents the voltage at the measurement point; i(t) represents the current at the measurement point, R represents a resistance value of a resistor in the lumped parameter model, and L represents an inductance value of an inductor in the lumped parameter model and $$\frac{di(t)}{dt}$$

represents the differential value of the current i(t). If we consider the discrete time system domain, for example a sample point at time instant k, the following equation (8') can be used to represent the calculation in equation (8).

$$u_{q\_k} = u_k - \left( R \cdot i_k + L \cdot \frac{di_k}{dt} \right) \quad (8')$$

wherein $u_{q\_k}$ represents the voltage at the setting point; $u_k$ represent the voltage at the measurement point; $i_k$ represents the current at the measurement point and L represents the inductance of inductor in the lumped parameter model (for example the RLC model); R represents the resistance of a resistor in the lumped parameter model (for example the RLC model);

$$\frac{di_k}{dt}$$

represents the differential value of the current $i_k$ ($di_k=i_k-i_{k-1}$; dt=a sample interval for the given sampling rate; $i_{k-1}$ means the measured current at the time instant k−1 which is previous of time instant k in the discrete time domain)

Figure 5:
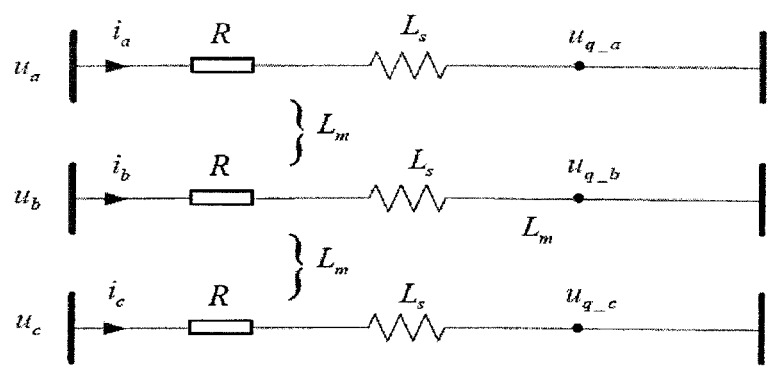
FIG. 5 schematically illustrates a three-line diagram for the transmission line according to an embodiment of the present disclosure.

Further for illustration purposes, FIG. 5 illustrates a three-line diagram for the transmission line according to an embodiment of the present disclosure. In FIG. 5, a model for three phase lines is described. The model for each of phase A, phase B, and phase C is similar to the single line diagram as illustrated in FIG. 4. In addition to it, phase to phase mutual inductance $L_m$, is added. Also, the phase inductance L illustrated in FIG. 4 is represented by $L_s$ in FIG. 5 to distinguish the phase inductance and the inductance between phases.

In order to detect faults, six-loop voltages could be used for the discrete time domain voltage determination. This means, in the time instant k, it may determine phase voltages $u_{q\_a\_k}$, $u_{q\_b\_k}$ and $u_{q\_c\_k}$ which represent the phase voltage for phase A, phase B and phase C at the setting point. Furthermore, it may further determine phase to phase voltages $u_{q\_ab\_k}$, $u_{q\_bc\_k}$, and $u_{q\_ca\_k}$, which respectively represent a voltage between phase A and phase B, a voltage between phase B and phase C, a voltage between phase C and phase A.

With the three-line diagram, it may determine voltages $u_{q\_a\_k}$, $u_{q\_b\_k}$ and $u_{q\_c\_k}$ based on equation (8) by further taking mutual inductance between phases into consideration. For example, voltages $u_{q\_a\_k}$, $u_{q\_b\_k}$ and $u_{q\_c\_k}$ can be determined based on the differential equation such as:

$$\begin{cases} u_{q\_a\_k} = u_{a\_k} - \left[R \cdot i_{a\_k} + L_s \cdot \frac{di_{a\_k}}{dt} + L_m \cdot \frac{di_{b\_k}}{dt} + L_m \cdot \frac{di_{c\_k}}{dt}\right] \\ u_{q\_b\_k} = u_{b\_k} - \left[R \cdot i_{b\_k} + L_s \cdot \frac{di_{b\_k}}{dt} + L_m \cdot \frac{di_{a\_k}}{dt} + L_m \cdot \frac{di_{c\_k}}{dt}\right] \\ u_{q\_c\_k} = u_{c\_k} - \left[R \cdot i_{c\_k} + L_s \cdot \frac{di_{c\_k}}{dt} + L_m \cdot \frac{di_{a\_k}}{dt} + L_m \cdot \frac{di_{b\_k}}{dt}\right] \end{cases} \quad (9)$$

wherein $u_{a\_k}$, $u_{b\_k}$ and $u_{c\_k}$ respectively represents line voltages for phase phase B and phase C at the measurement point; $i_{a\_k}$ $i_{b\_k}$ $i_{c\_k}$ respectively represents currents for phase A, phase B and phase C at the measurement point; $L_s$ represents the phase inductance for phase A, phase B and phase C; and $L_m$ represents the inductance between phases for phase A, phase B and phase C.

Since the phase to phase voltage is a voltage difference between one phase and another phase, thus the phase-to-phase voltages $u_{q\_ab\_k}$, $u_{q\_bc\_k}$, and $u_{q\_ca\_k}$ can be further determined based on the phase voltages $u_{q\_a\_k}$, $u_{q\_b\_k}$ and $u_{q\_c\_k}$ determined based on equation (9). For example, the voltage $u_{q\_ab\_k}$, i.e. the voltage between phase A and B at the setting point, can determined by:

$$u_{q\_ab\_k} = u_{q\_a\_k} - u_{q\_b\_k} = u_{ab\_k} - \qquad (10)$$
$$\left[R \cdot i_{ab\_k} + (L_s - L_m) \cdot \frac{di_{ab\_k}}{dt}\right]$$
$$= u_{ab\_k} - \left[R \cdot i_{ab\_k} + L \cdot \frac{di_{ab\_k}}{dt}\right]$$

wherein $u_{ab\_k}$, $i_{ab\_k}$ respectively represent the voltage and current between phase A and phase B at the measurement point; R and L mean a positive sequence resistance and inductance for the phase line, L equals to the difference of Ls and Lm, i.e., $L=L_s-L_m$.

According to the differential equation (10), the phase-to-phase voltages $u_{q\_ab\_k}$, $u_{q\_bc\_k}$, and $u_{q\_ca\_k}$ can be determined by the differential equations such as $$\begin{cases} u_{q\_ab\_k} = u_{ab\_k} - \left(R \cdot i_{ab\_k} + L \cdot \frac{di_{ab\_k}}{dt}\right) \\ u_{q\_bc\_k} = u_{bc\_k} - \left(R \cdot i_{bc\_k} + L \cdot \frac{di_{bc\_k}}{dt}\right) \\ u_{q\_ca\_k} = u_{ca\_k} - \left(R \cdot i_{ca\_k} + L \cdot \frac{di_{ca\_k}}{dt}\right) \end{cases} \quad (11)$$

wherein $u_{ab\_k}$, $i_{ab\_k}$ respectively represents the voltage and current between phase A and phase B at the measurement point; $u_{bc\_k}$, $i_{bc\_k}$ respectively represent the voltage and current between phase B and phase C at the measurement point; $u_{ca\_k}$, $i_{ca\_k}$ respectively represent the voltage and current between phase C and phase A at the measurement point; R and L mean the positive sequence resistance and inductance for the phase line, L equals to the difference of $L_s$ and Lm, i.e., $$L=L_s-L_m \qquad (12)$$

Thus, we can determine the phase voltages $u_{q\_a\_k}$, $u_{q\_b\_k}$ and $u_{q\_c\_k}$ and the phase-to-phase voltages $u_{q\_ab\_k}$, $u_{q\_bc\_k}$, and $u_{q\_ca\_k}$. It shall be understood that although the phase voltages $u_{q\_a\_k}$, $u_{q\_b\_k}$, and $u_{q\_c\_k}$ and the phase-to-phase voltages $u_{q\_ab\_k}$, $u_{q\_bc\_k}$, and $u_{q\_ca\_k}$ are described as to be determined based on equation (9) and (11) respectively, the present disclosure is not limited to these embodiments. In fact, it is possible to use any suitable form of differential equations.

For example, the phase voltages $u_{q\_a\_k}$, $u_{q\_b\_k}$ and $u_{q\_c\_k}$ can be determined based on the following equations.

$$\begin{cases} u_{q\_a\_k} = u_{a\_k} - \left[R \cdot (i_{a\_k} + k_R \cdot 3i_{0\_k}) + L \cdot \frac{d(i_{a\_k} + k_L \cdot 3i_{0\_k})}{dt}\right] \\ u_{q\_b\_k} = u_{b\_k} - \left[R \cdot (i_{b\_k} + k_R \cdot 3i_{0\_k}) + L \cdot \frac{d(i_{b\_k} + k_L \cdot 3i_{0\_k})}{dt}\right] \\ u_{q\_c\_k} = u_{c\_k} - \left[R \cdot (i_{c\_k} + k_R \cdot 3i_{0\_k}) + L \cdot \frac{d(i_{c\_k} + k_L \cdot 3i_{0\_k})}{dt}\right] \\ k_R = \frac{R_0 - R_1}{3R_1} \quad k_L = \frac{L_0 - L_1}{3L_1} \end{cases} \quad (13)$$

wherein $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$ represents zero sequence current at instant k; $K_R$ represents a factor determined based on $R_0$, $R_1$ as indicated in equation (13); $K_L$ represents a factor determined based on $L_0$, $L_1$ as indicated in equation (13).

After obtaining the voltages at the setting point, a super-fast line protection may be performed based on a fault detection criterion, which can also be called a line protection criteria. Reference is made back to FIG. 1, in step 150 a voltage change between the determined voltage at the setting point during fault period and a voltage at the setting point determined during a pre-fault period is first determined and then in step 160, the fault detection is determined based on the determined voltage change and a fault threshold.

For illustrative purposes, the following formula (14) gives an example fault detection criteria as follows:

$$\begin{cases} |\Delta U_q| > K_{rel} \cdot |U'_q| \\ \Delta U_q = U_q - U'_q \end{cases} \quad (14)$$

wherein $U_q$ represents the determined voltage at the setting point at the current time point, and $U'_q$ represents the determined voltage at the setting point at the previous time point and $\Delta U_q$, represents the difference between the voltage $U_q$ and the voltage $U'_q$, and $K_{rel}$ represents a reliable coefficient, which can be an value larger than 1, for example is 1.5. In a case that $K_{rel}$ is 1, it is same as the traditional fault detection criteria; however, the use of reliable coefficient provides flexibility to the detection threshold and it also may improve the detection reliability.

From criteria (14), it can be seen that if the voltage change between the voltage $U_q$ and the voltage $U'_q$ is larger than the multiple of $|U'_q|$, a fault is detected in the protection zone. For six-loop voltages determined herein above, the fault detection criteria can be given as follows:

$$\begin{cases} |\Delta U_{qa}| > K_{rel} \cdot |U'_{qa}| \\ |\Delta U_{qb}| > K_{rel} \cdot |U'_{qb}| \\ |\Delta U_{qc}| > K_{rel} \cdot |U'_{qc}| \\ |\Delta U_{qab}| > K_{rel} \cdot |U'_{qab}| \\ |\Delta U_{qbc}| > K_{rel} \cdot |U'_{qbc}| \\ |\Delta U_{qca}| > K_{rel} \cdot |U'_{qca}| \end{cases} \quad (15)$$

In addition, in some cases, for example, during a power swing period, it is also possible to use fixed voltage such as the rated voltages to replace determined voltages in the setting point q.

Therefore, in embodiments of the present disclosure, the fault component (compensated) voltage at the setting point (e.g., the end of the protection zone) can be determined, and then the fault component voltage can be compared with a setting fault threshold or a restrain value. If the voltage difference is bigger than the setting fault threshold, it means a fault within the protection zone, i.e., an internal fault; otherwise it is a fault outside the protection zone, i.e., an external fault.

For the internal fault, the compensated voltage at the end of the protected zone is larger than the rated voltage level. While, for the external faults (forward or backward), the compensated voltage is smaller than the rated voltage level. Such an obvious difference between internal and external faults can be used to detect whether or not the fault is within the protected zone, e.g. the zone 1 for line protection.

Hereinafter, only for illustrative purpose, reference will be next made to FIGS. 6 to 8 to describe some simulations made for the solution as provided in the present disclosure.

Figure 6:
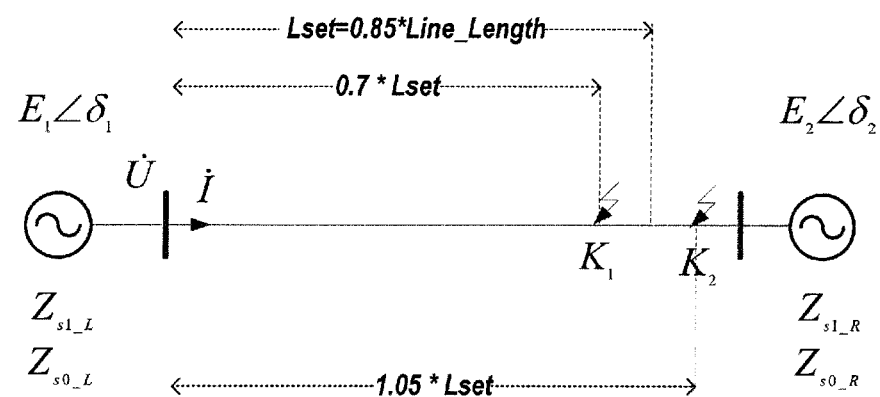
FIG. 6 schematically illustrates a transmission line system model based on which simulations are implemented for the solution according to an embodiment of the present disclosure.
Figure 7:
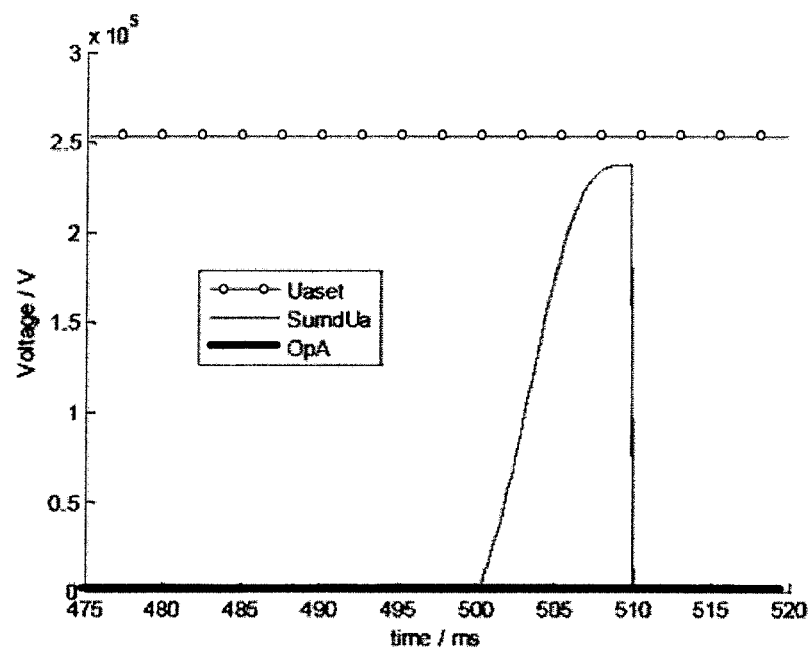
FIG. 7 schematically illustrates simulation results for external faults occurring at point K2 according to embodiments of the present disclosure.
Figure 8:
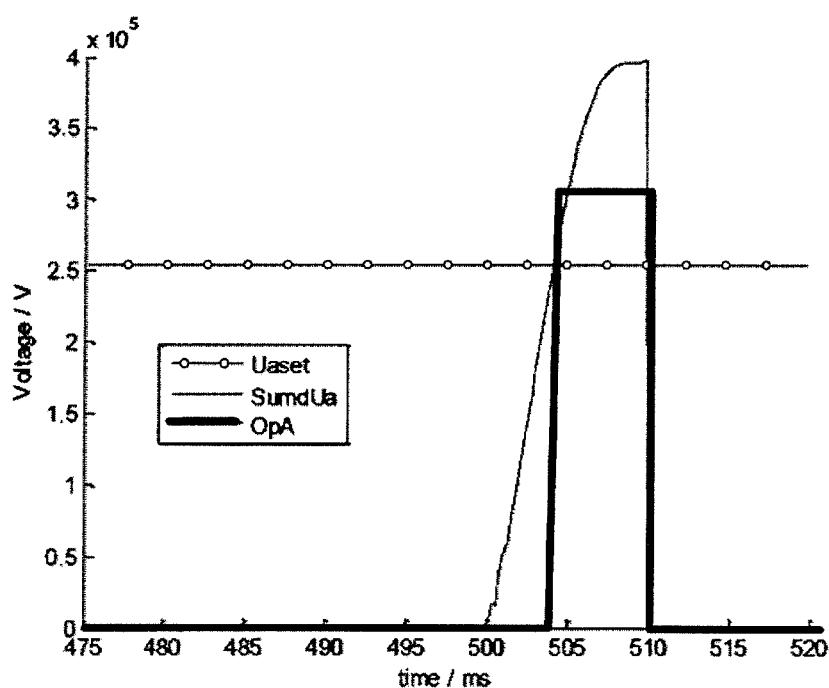
FIG. 8 schematically illustrates simulation results for AG fault occurring at points K1 respectively according to embodiments of the present disclosure.

FIG. 6 illustrates a simulation model and FIG. 7 to FIG. 8 illustrates simulations with regards various faults at different points on the transmission line. In the simulation model, the voltage level is 245 kV; the length of the transmission line is 100 km; the system impedances of power source are respectively $Z_{s1\_L}=5e^{j89°}$, $Z_{s0\_L}=5e^{j80°}$, $Z_{s1\_R}=15e^{j89°}$, $Z_{s0\_R}=15e^{j80°}$, wherein $Z_{s1\_L}$ represents the positive sequence impedance at the local end, $Z_{s0\_L}$ represents the zero sequence impedance at the local end; $Z_{s1\_R}$, represents the positive sequence impedance at the remote end, $Z_{s0\_R}$ the zero sequence impedance at the remote end. The power sources at the local end and the remote end are $E_1=E_2=245$ kV, and $\delta 1=40°$, $\delta_2=20°$, wherein E1, E2 represent amplitudes of voltages of the power sources and $\delta_1$ and $\delta_2$ respectively represents the phase angels of voltages of the power sources. In the simulation, the protection scope is set as 85% of the length of the transmission line, i.e., Lset=0.85*Line_Length, wherein Lset represents the length of the protection scope and the Line_length represents the length of the transmission line. In the simulation model illustrated in the FIG. 6, K1 is at the point which is 70% of the length protection zone (0.7*Lset) from the bus; K2 is a point beyond the protection scope and is 1.05*Lset from the bus to simulate an external fault.

External Faults

For external faults, simulations are made at point K2 for the above types. Simulation results show that the proposed solution of the present disclosure does not mal-operate for the external faults. For illustration purposes, FIG. 7 has shown simulation results for AG fault, wherein "$U_{aset}$" represent the set fault detection threshold; "SumUa" represents the determined voltage change $\Delta U_q$ at the setting point; and "OpA" represents the operation status of proposed solution, i.e. whether a protection operation is triggered. Specifically, if the operation status keeps low, it means no detection of fault and thus no protection is triggered; otherwise, an internal fault is detected and the line protection is triggered. From FIG. 7, it is clear that for the external fault, there are enough margins to ensure that no internal fault is detected by mistake and thus the reliability of fault detection could be secured.

Internal Faults

Internal faults mean faults occurring within the protection zone of the protection device, and these faults are those shall be detected for line protection. Thus, if there is an internal fault, it shall be detected and triggers the line protection. For the internal faults, phase A grounded metal fault, i.e., AG is simulated at points K1. Simulation results show that the solution of the present disclosure can operate in a very short time after the fault occurs.

For illustration purposes, FIG. 8 schematically illustrate simulation results for AG fault occurring at point K1 according to an embodiment of the present disclosure. In the figures, 'Uaset' presents the setting detection voltage threshold $U'_{qa}$ and 'SumdUa' presents the determined voltage change, or the operate quantity $|\Delta U'_{qa}|$; and 'OpA' presents the operation status of the solution of the present disclosure.

Reference is made FIG. 8, which shows the simulation result when an internal phase A to ground fault occurs at point K1. From FIG. 8, it is clear that the operation quantity exceeds the fault threshold quickly and the proposed solution operates at about 4 ms after the fault inception.

By contrast, in conventional line protection, it calculates the impedance to distinguish fault location. It is difficult to get the accurate result within for example 20 ms when using a full-cycle Fourier algorithm. Some short-window filters were developed to increase the operation speed such as the half-cycle Fourier method. However, the calculation error increased simultaneously and the protection zone must be reduced greatly to ensure the reliability. Even with reduced protection zone when using short-window filter, a certain waiting time is still needed to ensure the reliability. Therefore, it cannot works well after faults. The proposed solution works right after the fault inception in time domain. It almost does not need the waiting time, so that the ultra-high operation speed can be obtained. Besides, it uses differential equation to calculate the voltage at setting point instead of calculating vector by the Fourier algorithm. Thus, the error in calculating vector by few fault data is bypassed and no very high sampling rate is required.

Figure 9:
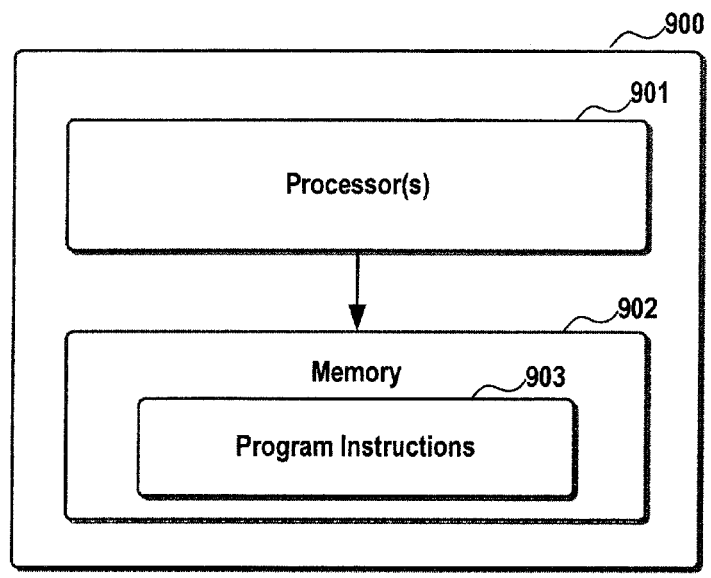
FIG. 9 schematically illustrates a system for fault detection in line protection for a power transmission system according to an embodiment of the present disclosure.

FIG. 9 further illustrates a system 900 for fault detection in line protection for a power transmission system according to an embodiment of the present disclosure. As illustrated in FIG. 9, the system 900 can comprise one or more processors 901; a memory 902 coupled to at least one of the processors 901; and a set of program instructions 903 stored in the memory 902. The set of program instructions 903 is executable by at least one of the processors 901 to cause the system 900 to obtain a voltage at a measurement point, on an electrical line. The measurement point is a point at which a protection device for the line protection is installed. The system 900 may be further configured to obtain a current at the measurement point and determine a differential value of the current. The system 900 can be moreover configured to determine a voltage at a setting point on the electrical line from the voltage at the measurement point, the current at the measurement point and the differential value of the current according to a time domain lumped parameter model for the electrical line. The system 900 is also configured to determine a voltage change between the determined voltage at the setting point during fault period and a voltage at the setting point determined during a pre-fault period and perform the fault detection based on the determined voltage change and a fault threshold.

In embodiments of the present disclosure, the determining a voltage at a setting point may be performed based on a differential equation, for example those illustrated in equations (8), (9), (11) and (13).

In embodiments of the present disclosure, the differential equation may include:

$$u_q(t) = u(t) - R * i(t) - L * \frac{di(t)}{dt}$$

wherein u(t) represents the voltage at the measurement point; i(t) represents the current at the measurement point, R represents a resistance value of a resistor in the lumped parameter model, and L represents an inductance value of an inductor in the lumped parameter model and $$\frac{di(t)}{dt}$$

represents the differential value of the current i(t).

In embodiments of the present disclosure, the RLC model may comprise any of a Resistor-Inductor-Capacitor (RLC) model or a Resistor-Inductor (RL) mode.

In embodiments of the present disclosure, the obtaining a current at the measurement point may comprise obtaining a phase current at the measurement point; removing, from the phase current, at least one of a capacitive current to the ground, and a capacitive current between phases.

In embodiments of the present disclosure, the fault threshold is a product of a reliable coefficient and the voltage at the setting point determined during the pre-fault period.

In embodiments of the present disclosure, the fault threshold is a product of a reliable coefficient and a rating voltage of the electrical line.

It can be understood that the above-mentioned operations of system 900 described with regard to FIG. 9 correspond to those operations of the methods described with FIGS. 1 to 8 and thus detailed operations of these modules will not be elaborated herein for the conciseness purpose.

In addition to the method and system described hereinabove, there is also presented an apparatus for fault detection in line protection which will be described with reference to FIG. 10.

Figure 10:
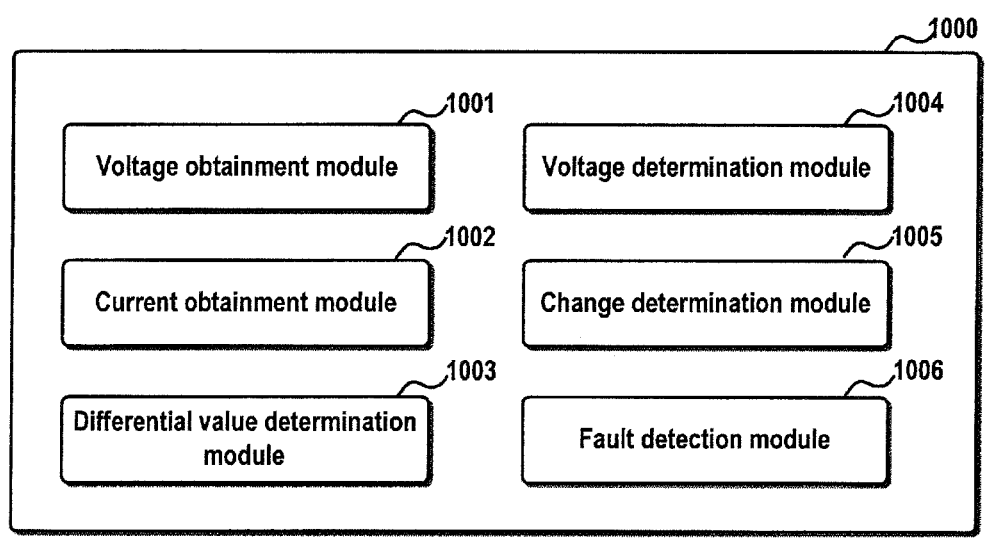
FIG. 10 schematically illustrates an apparatus for fault detection in line protection for a power transmission system according to an embodiment of the present disclosure.

As illustrated in FIG. 10, there is illustrated an apparatus 1000 for fault detection in line protection. The apparatus 1000 may comprise a voltage obtainment module 1001, a current obtainment module 1002, a differential value determination module 1003, a voltage determination module 1004, a change determination module 1005 and a fault detection module 1006. The voltage obtainment module 1001 can be configured to obtain a voltage at a measurement point on an electrical line. The measurement point is a point at which a protection device for the line protection is installed. The current obtainment module 1002 can be configured to obtain a current at the measurement point. The differential value determination module 1003 can be configured to determine a differential value of the current. The voltage determination module 1004 can be configured to determine a voltage at a setting point on the electrical line from the voltage at the measurement point, the current at the measurement point and the differential value of the current according to a time domain lumped parameter model for the electrical line. The change determination module 1005 is configured to determine a voltage change between the determined voltage at the setting point during fault period and a voltage at the setting point determined during a pre-fault period. The fault detection module 1006 may be configured to perform the fault detection based on the determined voltage change and a fault threshold.

In embodiments of the present disclosure, the voltage determination module 1004 can be further configured to determine the voltage at a setting point based on a differential equation.

In embodiments of the present disclosure, the differential equation may include:

$$u_q(t) = u(t) - R * i(t) - L * \frac{di(t)}{dt}$$

wherein u(t) represents the voltage at the measurement point; i(t) represents the current at the measurement point, R represents a resistance value of a resistor in the lumped parameter model, and L represents an inductance value of an inductor in the lumped parameter model and $$\frac{di(t)}{dt}$$

represents the differential value of the current i(t).

In embodiments of the present disclosure, the RLC model may comprise any of a Resistor-Inductor-Capacitor (RLC) model or a Resistor-Inductor (RL) mode.

In embodiments of the present disclosure, the current obtainment module 1002 may be further configured to obtain a current at the measurement point may comprise obtaining a phase current at the measurement point; remove, from the phase current, at least one of a capacitive current to the ground, and a capacitive current between phases.

In embodiments of the present disclosure, the fault threshold is a product of a reliable coefficient and the voltage at the setting point determined during the pre-fault period.

In embodiments of the present disclosure, the fault threshold is a product of a reliable coefficient and a rating voltage of the electrical line.

It can be understood that the above-mentioned modules regarding to FIG. 10 can be configured to perform corresponding operations of the methods described with FIGS. 1 to 8 and thus detailed operations of these modules will not be elaborated herein for the conciseness purpose.

It is to be understood that specific embodiments of the present disclosure are described with reference to the accompanying drawings; however, they are presented only for illustration purposes and the present disclosure is not limited thereto. For example, the embodiments are described mainly with reference to the EHV/UHV transmission line systems; however the present disclosure it not limited thereto, and it is possible to apply in any other line systems for line protection; in fault detections, six-loop voltages are determined but in fact, it is possible to use less than six loop voltages, which is dependent on application requirements. In addition, although specific equations, circuit structure, or models are described in the present disclosure; however the present disclosure is not limited thereto and the skilled in the art could make modifications thereto without departing the ideas and sprits as provided herein. For example, although a PI-type RLC model is used, it is also possible to use a T-type RLC model, or some modified version thereof.

The skilled in the art can also appreciate that the solution as provided herein may take the form of a hardware embodiment, a software embodiment (including firmware, resident software, micro-code, etc.) or an embodiment combining software and hardware aspects. That is to say, the reference face determination, start & search point determination, via points determination and instruction generations can be implemented by electronic elements or devices, software stored in storage device, or the combination of electronic devices and the software, for example by micro-processors, digital signal processor, simple chip machine, and suitable programs etc.

Hereinabove, embodiments of the present disclosure have been described in details through embodiments with reference to the accompanying drawings. It should be appreciated that, while this specification contains many specific implementation details, these details should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Various modifications, adaptations to the foregoing exemplary embodiments of this disclosure may become apparent to those skilled in the relevant arts in view of the foregoing description, when read in conjunction with the accompanying drawings. Any and all modifications will still fall within the scope of the non-limiting and exemplary embodiments of this disclosure. Furthermore, other embodiments of the disclosures set forth herein will come to mind to one skilled in the art to which these embodiments of the disclosure pertain having the benefit of the teachings presented in the foregoing descriptions and the associated drawings.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A method for fault detection in line protection for a power transmission system, comprising:
   obtaining a voltage at a measurement point, at which a protection device for the line protection is installed, on an electrical line;
   obtaining a current at the measurement point;
   determining a differential value of the current;
   determining a voltage at a setting point on the electrical line from the voltage at the measurement point, the current at the measurement point and the differential value of the current according to a time domain lumped parameter model for the electrical line;
   determining a voltage change between the determined voltage at the setting point during a fault period and a voltage at the setting point determined during a pre-fault period; and
   performing the fault detection based on the determined voltage change and a fault threshold, wherein the fault threshold set such that the voltage change exceeds the fault threshold in response to an internal fault within a protection zone of the protection device, and such that the voltage change does not exceed the fault threshold in response to an external fault outside of the protection zone of the protection device.

2. The method of claim 1, wherein the determining the voltage at the setting point is performed based on a differential equation.

3. The method of claim 2, wherein the differential equation based on time domain lumped parameters includes:

$$u_q(t) = u(t) - R * i(t) - L * \frac{di(t)}{dt}$$

wherein u(t) represents the voltage at the measurement point; i(t) represents the current at the measurement point, R represents a resistance value of a resistor in the lumped parameter model, and L represents an inductance value of an inductor in the lumped parameter model and $$\frac{di(t)}{dt}$$

represents the differential value of the current i(t).

4. The method of claim 3, wherein the obtaining the current at the measurement point comprises:
  obtaining a phase current at the measurement point; and
  removing, from the phase current, at least one of a capacitive current to ground or a capacitive current between phases.

5. The method of claim 2, wherein the obtaining the current at the measurement point comprises:
  obtaining a phase current at the measurement point; and
  removing, from the phase current, at least one of a capacitive current to ground a capacitive current between phases.

6. The method of claim 1, wherein the lumped parameter model comprises a Resistor-Inductor-Capacitor (RLC) model.

7. The method of claim 6, wherein the obtaining the current at the measurement point comprises:
  obtaining a phase current at the measurement point; and
  removing, from the phase current, at least one of a capacitive current to ground or a capacitive current between phases.

8. The method of claim 1, wherein the lumped parameter model comprises a Resistor-Inductor (RL) model.

9. The method of claim 1, wherein the obtaining the current at the measurement point comprises:
  obtaining a phase current at the measurement point; and
  removing, from the phase current, at least one of a capacitive current to ground and a capacitive current between phases.

10. The method of claim 1, wherein the fault threshold is a product of a reliable coefficient and a rating voltage of the electrical line.

11. The method of claim 1, wherein the fault threshold is a product of a reliable coefficient and the voltage at the setting point determined during the pre-fault period.

12. A system for fault detection in line protection for a power transmission system, comprising:
  one or more processors;
  a memory coupled to at least one of the processors; and
  a set of program instructions stored in the memory and executable by at least one of the processors to cause the system to:
    obtain a voltage at a measurement point, at which a protection device for the line protection is installed, on an electrical line;
    obtain a current at the measurement point;
    determine a differential value of the current;
    determine a voltage at a setting point on the electrical line from the voltage at the measurement point, the current at the measurement point and the differential value of the current according to a time domain lumped parameter model for the electrical line;
    determine a voltage change between the determined voltage at the setting point during a fault period and a voltage at the setting point determined during a pre-fault period; and
    perform the fault detection based on the determined voltage change and a fault threshold, wherein the fault threshold set such that the voltage change exceeds the fault threshold in response to an internal fault within a protection zone of the protection device, and such that the voltage change does not exceed the fault threshold in response to an external fault outside of the protection zone of the protection device.

13. The system of claim 12, wherein the determining the voltage at the setting point is performed based on a differential equation.

14. The system of claim 13, wherein the differential equation based on time domain lumped parameters includes:

$$u_q(t) = u(t) - R * i(t) - L * \frac{di(t)}{dt}$$

wherein u(t) represents the voltage at the measurement point; i(t) represents the current at the measurement point, R represents a resistance value of a resistor in the lumped parameter model, and L represents an inductance value of an inductor in the lumped parameter model and $$\frac{di(t)}{dt}$$

represents the differential value of the current i(t).

15. The system of claim 14, wherein the lumped parameter model comprises a Resistor-Inductor-Capacitor (RLC) model.

16. The system of claim 14, wherein the lumped parameter model comprises a Resistor-Inductor (RL) model.

17. The system of claim 12, wherein the obtaining the current at the measurement point comprises:
  obtaining a phase current at the measurement point; and
  removing, from the phase current, at least one of a capacitive current to ground, and a capacitive current between phases.

18. The system of claim 12, wherein the fault threshold is a product of a reliable coefficient and a rating voltage of the electrical line.

19. The system of claim 12, wherein the fault threshold is a product of a reliable coefficient and the voltage at the setting point determined during the pre-fault period.

20. An apparatus for fault detection in line protection for a power transmission system, comprising:
  a voltage obtainment module, configured to obtain a voltage at a measurement point, at which a protection device for the line protection is installed, on an electrical line;
  a current obtainment module, configured to obtain a current at the measurement point;
  a differential value determination module, configured to determine a differential value of the current;
  a voltage determination module, configured to determine a voltage at a setting point on the electrical line from the voltage at the measurement point, the current at the measurement point and the differential value of the current according to a time domain lumped parameter model for the electrical line;
  a change determination module, configured to determine a voltage change between the determined voltage at the setting point during a fault period and a voltage at the setting point determined during a pre-fault period; and
  a fault detection module, configured to perform the fault detection based on the determined voltage change and a fault threshold, wherein the fault threshold set such that the voltage change exceeds the fault threshold in response to an internal fault within a protection zone of the protection device, and such that the voltage change does not exceed the fault threshold in response to an external fault outside of the protection zone of the protection device.

21. The apparatus of claim 20, wherein the fault threshold is a product of a reliable coefficient and a rating voltage of the electrical line.

22. The apparatus of claim 20, wherein the fault threshold is a product of a reliable coefficient and the voltage at the setting point determined during the pre-fault period.

* * * * *

UNITED STATES PATENT AND TRADEMARK OFFICE
CERTIFICATE OF CORRECTION

PATENT NO. : 11,652,347 B2
APPLICATION NO. : 16/103141
DATED : May 16, 2023
INVENTOR(S) : Kai Liu et al.

Page 1 of 1

It is certified that error appears in the above-identified patent and that said Letters Patent is hereby corrected as shown below:

On the Title Page

Item (73) Assignee; delete "Hitachi Energy Switzerland Ltd" and insert --Hitachi Energy Switzerland AG--.

Signed and Sealed this
Twenty-fourth Day of September, 2024

Katherine Kelly Vidal
*Director of the United States Patent and Trademark Office*